United States Patent [19]
Cooper

[11] Patent Number: 5,552,751
[45] Date of Patent: Sep. 3, 1996

[54] LOW VOLTAGE, LOW POWER OSCILLATOR HAVING VOLTAGE LEVEL SHIFTING CIRCUIT

[75] Inventor: Russell E. Cooper, Chandler, Ariz.

[73] Assignee: Microchip Technology Inc., Chandler, Ariz.

[21] Appl. No.: 469,176

[22] Filed: Jun. 6, 1995

[51] Int. Cl.$^6$ .................. H03B 5/36; H03B 5/06
[52] U.S. Cl. .................. 331/116 FE; 331/158; 331/173; 331/185
[58] Field of Search .................. 331/116 FE, 185, 331/116 R, 117 R, 117 FE, 57, 158, 173, 186

[56] References Cited

U.S. PATENT DOCUMENTS

| | | | |
|---|---|---|---|
| 4,918,408 | 4/1990 | Sakihama et al. | 331/116 R |
| 5,126,695 | 6/1992 | Abe | 331/46 |
| 5,457,433 | 10/1995 | Westwick | 331/116 FE |

Primary Examiner—David Mis
Attorney, Agent, or Firm—Wigman, Cohen, Leitner & Myers, P.C.

[57] ABSTRACT

An oscillator circuit (30, 40) for starting-up and operating at low voltages has been provided. The oscillator circuit includes an inverter circuit(31, 41) coupled across first and second terminals of a resonant circuit (14). The inverter circuit includes a push-pull driver stage having a P-channel transistor (18) and an N-channel transistor (20). The common drain electrodes of each are coupled to the second terminal of the resonant circuit. The source electrodes of the P- and N-channel transistors are respectively coupled to first and second supply voltage terminals. The gate electrode of the first transistor is coupled to the first terminal of resonant circuit. The inverter circuit further includes a circuit (32, 42) for shifting the voltage level applied to the gate electrode of the second transistor, relative to the voltage applied to the gate electrode of the first transistor, by a predetermined voltage. This has the effect of reducing the required operating voltage range of the inverter circuit while still maintaining both transistors active.

14 Claims, 2 Drawing Sheets

5,552,751

LOW VOLTAGE, LOW POWER OSCILLATOR HAVING VOLTAGE LEVEL SHIFTING CIRCUIT

BACKGROUND OF THE INVENTION

The invention relates generally to oscillator circuits and, in particular, to an oscillator circuit that is capable of starting and operating at low voltages with few components and, thus, consume less power.

Oscillator circuits are used in a myriad of applications in the electronics industry for providing clock and other timing signals to electronic circuitry such as microprocessors, microcontrollers, flip-flop circuits, latch circuits, etc. Oscillator circuits typically generate an electronic signal that oscillates at some predetermined frequency between a first voltage level and a second voltage level. The first and second voltage levels are typically determined by the level of the supply voltage applied to the circuit, while the predetermined frequency is typically determined by the resonant frequency of a resonant circuit such as a crystal, resonator or series RLC circuit.

One common way to build an oscillator circuit is to couple a resonant circuit across an inverter circuit. Several types of inverter structures may be used to accomplish the inversion function such as a complementary push-pull type inverter. These inverter types are typically used in low power applications because they require about one-half the power of non push-pull inverters, and do not experience the high frequency limitation of non push-pull inverters.

Referring to FIG. 1, a prior art implementation of an oscillator circuit (10) including a push-pull inverter circuit (12) coupled across a resonant circuit (14) is shown. Resonant circuit 14 may take the form of a resonator, a crystal or a series resistor-inductor-capacitor (RLC) circuit such that resonant circuit 14 resonates (i.e., oscillates) at a predetermined frequency. In particular, resonant circuit 14 may take the form, for example, of a resonator having part number CSA 4.00 MG manufactured by muRata Erie.

Oscillator circuit 10 also includes a large value resistor 15, coupled across resonant circuit 14, for setting the quiescent condition during start-up and normal operation. Resistor 15 may have a value, for example, in the range of 1 Megohm to 12 Megohms.

Inverter circuit 12 includes a driver stage comprising P-channel transistor 18 and N-channel transistor 20. The gate/control electrodes of each are coupled to a first terminal of resonant circuit 14, while the drain electrodes (first current carrying electrode) of each are coupled to a second terminal of resonant circuit 14 and to output terminal 16 at which an output oscillatory signal is provided. The source electrode (second current carrying electrode) of transistor 18 is coupled to a first supply voltage terminal at which the operating potential $V_{DD}$ is applied, while the source electrode of transistor 20 is coupled to a second supply voltage terminal at which the operating potential $V_{SS}$ is applied.

Generally, resonant circuit 14 amplifies signals appearing at the output of inverter 12 that are at its resonant frequency and supplies these signals back to the input of inverter 12. Inverter 12 provides the 180 degree phase shift and gain required to begin and maintain oscillation. When functioning properly, oscillator circuit 10 provides an output signal at terminal 16 that oscillates at the resonant frequency of resonant circuit 14 while swinging between the voltage ranges of $V_{DD}$ and $V_{SS}$. As an example, if voltage $V_{DD}$ was 5 volts, voltage $V_{SS}$ was 0 volts, and the resonant frequency of resonant circuit 14 was 10 MHz, the signal appearing at terminal 16 would be an oscillatory (i.e., sinusoidal-type) signal swinging from approximately 0 to 5 volts at a frequency of 10 MHz.

However, for proper start-up, both transistors 18 and 20 must be maintained active (i.e., on) which requires that the minimum voltage between $V_{DD}$ and $V_{SS}$ be at least the sum of the threshold voltages of transistors 18 ($V_{TP18}$) and 20 ($V_{TN20}$), as represented in EQN. 1.

$$V_{DD}-V_{SS}>V_{TP18}+V_{TN20} \qquad \text{EQN. 1}$$

As an example, if threshold voltages $V_{TP18}$ and $V_{TN20}$ are both equal to 1.5 volts, then the voltage difference between the supply voltages must be at least 3 volts, plus a few tenths of a volt for overhead, to provide for proper start-up. This minimum voltage assures that each transistor remains active and that the voltage appearing at the gate electrodes of transistors 18 and 20 does not float. Therefore, if the voltage difference falls below 3 volts, then at least one of the transistors will be inactive and oscillator circuit 10 will not initiate oscillation from power-up. Such a minimum voltage requirement, however, conflicts with the general trend of reducing the operating supply voltages for electronic circuits since reducing voltages achieves many advantages such as longer battery life, use of fewer batteries and overall less power consumption.

Thus, it is a principal object of the present invention to provide an improved inverter circuit for use in an oscillator circuit that is capable of starting-up and operating with low supply voltages and, thus, consuming less power.

SUMMARY OF THE INVENTION

It is an object of the present invention to provide an oscillator circuit including an inverter circuit that requires relatively low supply voltages for proper start-up and operation.

Another object of the present invention is to provide an inverter circuit for operating at relatively low supply voltages and, thus, consuming relatively low power.

Briefly, the present invention provides a low voltage oscillator circuit for providing an output signal that oscillates at a frequency determined by a resonant circuit. The oscillator circuit includes an inverter circuit that is coupled across first and second terminals of the resonant circuit. The inverter circuit includes first and second transistors having common drain electrodes coupled to the output of the oscillator circuit and to the second terminal of the resonant circuit. The source electrodes of the first and second transistors are respectively coupled to first and second supply voltage terminals. The gate electrode of the first transistor is coupled to the first terminal of the resonant circuit. The inverter circuit further includes the improvement of a voltage level shifting circuit coupled between the first terminal of the resonant circuit and the gate electrode of the second transistor for shifting the voltage applied to the gate electrode of the second transistor relative to the gate electrode of the first transistor thereby allowing the oscillator circuit to operate at lower supply voltages while still maintaining the first and second transistors active. Alternately, the voltage level shifting circuit could be coupled between the first terminal of the resonant circuit and the gate electrode of the first transistor with the gate electrode of the second transistor coupled directly to the first terminal of the resonant circuit.

DETAILED DESCRIPTION OF THE DRAWINGS

Figure 1:
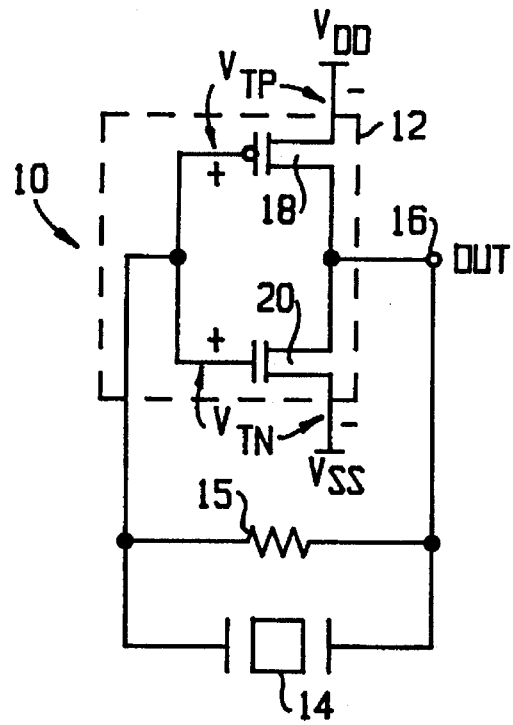
FIG. 1 is a detailed schematic diagram of a prior art implementation of an oscillator circuit; an oscillator circuit including a first embodiment of and FIG. 2 is a detailed schematic diagram illustrating inverter circuit for operating at low supply voltages.
Figure 2:
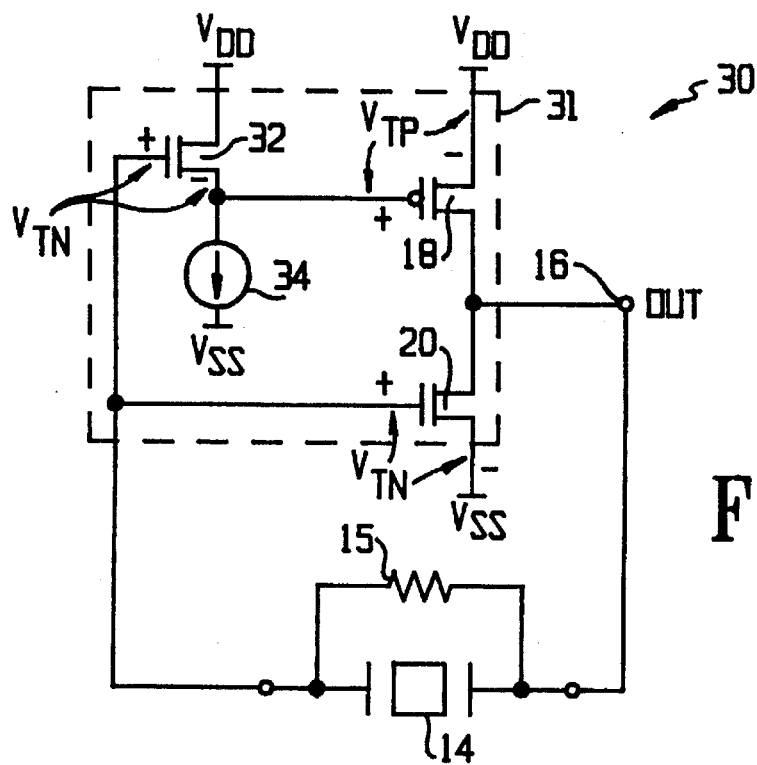

Referring to FIG. 2, a detailed schematic diagram of oscillator circuit 30 including inverter 31 for operating at reduced power supply voltages is shown. Components shown in FIG. 2 that are identical to, components shown in FIG. 1 are identified by the same reference numbers. Similar to inverter 12 of FIG. 1, inverter 31 of FIG. 2 is coupled across resonant circuit 14 for providing a signal at output terminal 16 that oscillates between the voltage range of $V_{DD}$ and $V_{SS}$ at a predetermined frequency as determined by the resonant frequency of resonant circuit 14.

However, inverter 31 additionally includes source follower transistor 32, coupled between resonant circuit 14 and the gate electrode of P-channel transistor 18, for allowing inverter 31 to maintain transistors 18 and 20 active at lower supply voltage levels (i.e., even if the difference between voltages $V_{DD}$ and $V_{SS}$ falls below the sum of threshold voltages $V_{TP18}$ and $V_{TN20}$). In particular, transistor 32 has a drain electrode coupled to the first supply voltage terminal for receiving operating potential $V_{DD}$, and a source electrode coupled through current Source 34 to a second supply voltage terminal for receiving operating potential $V_{SS}$. The source electrode of transistor 32 is also coupled to the gate electrode of transistor 18. Finally, the gate electrode of transistor 32 is coupled to the first terminal of resonant circuit 14.

In operation, transistor 32 functions to shift (i.e., reduce) the voltage level applied to the gate electrode of transistor 18, relative to the voltage level applied to the gate electrode of transistor 20, by the threshold voltage of transistor 32 ($V_{TN32}$). This level shift causes the operating ranges of transistors 18 and 20 to overlap and, thus, allows both transistors 18 and 20 to remain active at reduced supply voltage levels. As a result, the minimum voltage difference between $V_{DD}$ and $V_{SS}$ ($V_{DD}-V_{SS}$) is reduced with respect to the oscillator circuit 10 of FIG. 1 by the value of the threshold voltage of source follower transistor 32, as shown in EQN. 2.

$$V_{DD}-V_{SS}>V_{TP18}V_{TN20}-V_{TN32} \qquad \text{EQN. 2}$$

Referring back to the earlier example, if all threshold voltages are 1.5 volts, the minimum voltage difference between voltages $V_{DD}$ and $V_{SS}$ is now 1.5 volts since the threshold voltage of transistor 20 is offset by the threshold voltage of source follower transistor 32 as can be observed from EQN. 2. This is one-half the minimum voltage difference required for the earlier example of oscillator circuit 10 of FIG. 1. Thus, a substantial reduction of required power supply voltage levels for maintaining transistors 18 and 20 active has been achieved while still ensuring proper startup and operation of oscillator circuit 30.

In more general terms, the minimum voltage difference between voltages $V_{DD}$ and $V_{SS}$ required to maintain both transistors 18 and 20 active is the maximum of the threshold voltages of transistors 18 and 20, as represented in EQN. 3.

$$V_{DD}-V_{SS}>\text{MAX }[V_{TP18}, V_{TN20}] \qquad \text{EQN. 3}$$

Thus, if the threshold voltage of transistor 18 is greater than the threshold voltage of transistor 20, then the difference between voltages $V_{DD}$ and $V_{SS}$ can be as low as the threshold voltage of transistor 18, plus some small voltage for overhead. This will ensure that both transistors 18 and 20 are maintained active and that oscillation will be initiated and maintained. This represents a substantial improvement over the oscillator circuit of FIG. 1 which required the minimum voltage difference to be at least the sum of the threshold voltages of transistors 18 and 20 as expressed above in EQN. 1. Thus, the present invention provides an oscillator circuit including an inverter for operating at relatively low voltage levels.

Figure 3:
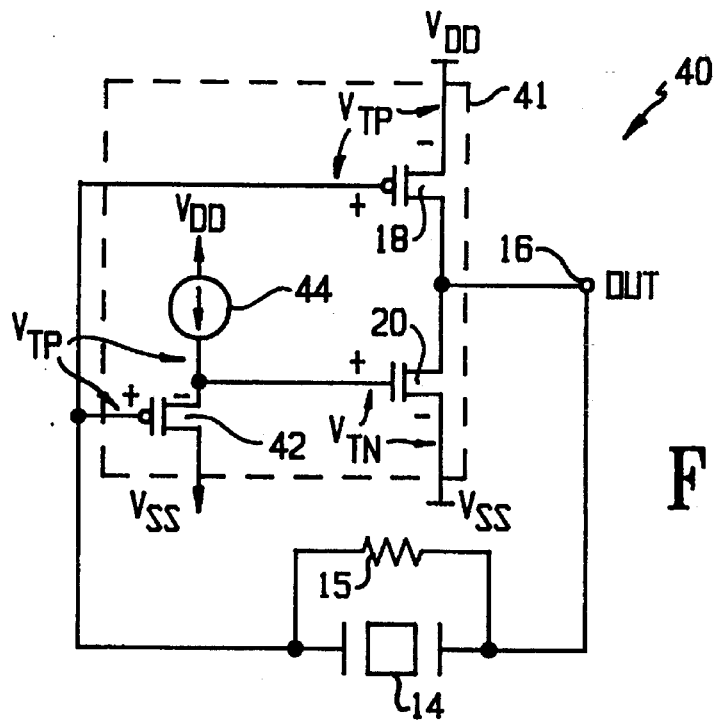
FIG. 3 is a detailed schematic diagram illustrating an oscillator circuit including a second embodiment of an inverter circuit for operating at low supply voltages; and, FIG. 4 is a detailed schematic diagram illustrating the oscillator circuit of FIG. 2 with circuitry for alternately operating in an on or off state.

As described above, source follower transistor 32 provided a voltage level shift to the gate electrode of transistor 18, relative to the voltage level applied to the gate electrode of transistor 20 thereby reducing the required voltage supply range of inverter 31. The same effect can also be accomplished by using a source follower transistor to provide a voltage level shift to the gate electrode of transistor 20, relative to the voltage level applied to the gate electrode of transistor 18. Referring to FIG. 3, a detailed schematic diagram of oscillator circuit 40 including an alternate embodiment of an inverter circuit (42) for operating at reduced power supply voltages is shown. Components shown in FIG. 3 that are identical to components shown in FIG. 1 are identified by the same reference numbers. The inverter shown in FIG. 3 is similar to the inverter of FIG. 2 except that the source follower transistor is a P-channel transistor that shifts (i.e., increases) the voltage level applied to the gate electrode of transistor 20, relative to the voltage applied to the gate electrode of transistor 18, by the threshold voltage of transistor 42 ($V_{TP42}$).

Inverter 41 additionally includes P-channel source follower transistor 42 having a source electrode coupled to the first supply voltage terminal for receiving operating potential $V_{DD}$, and a drain electrode coupled through current source 44 to the second supply voltage terminal for receiving operating potential $V_{SS}$. The source electrode of transistor 32 is also coupled to the gate electrode of transistor 20. Finally, the gate electrode of transistor 42 is coupled to the first terminal of resonant circuit 14.

Similar to inverter 31 of FIG. 2, the minimum voltage difference between $V_{DD}$ and $V_{SS}$ to maintain transistors 18 and 20 of FIG. 3 active is reduced by the value of the threshold voltage of source follower transistor 42, as shown in EQN. 4, with the limiting factor being the maximum of the threshold voltages of transistors 18 and 20, as was expressed in EQN. 3.

$$V_{DD}-V_{SS}>V_{TP18}+V_{TN20}-V_{TP42} \qquad \text{EQN. 4}$$

Figure 4:
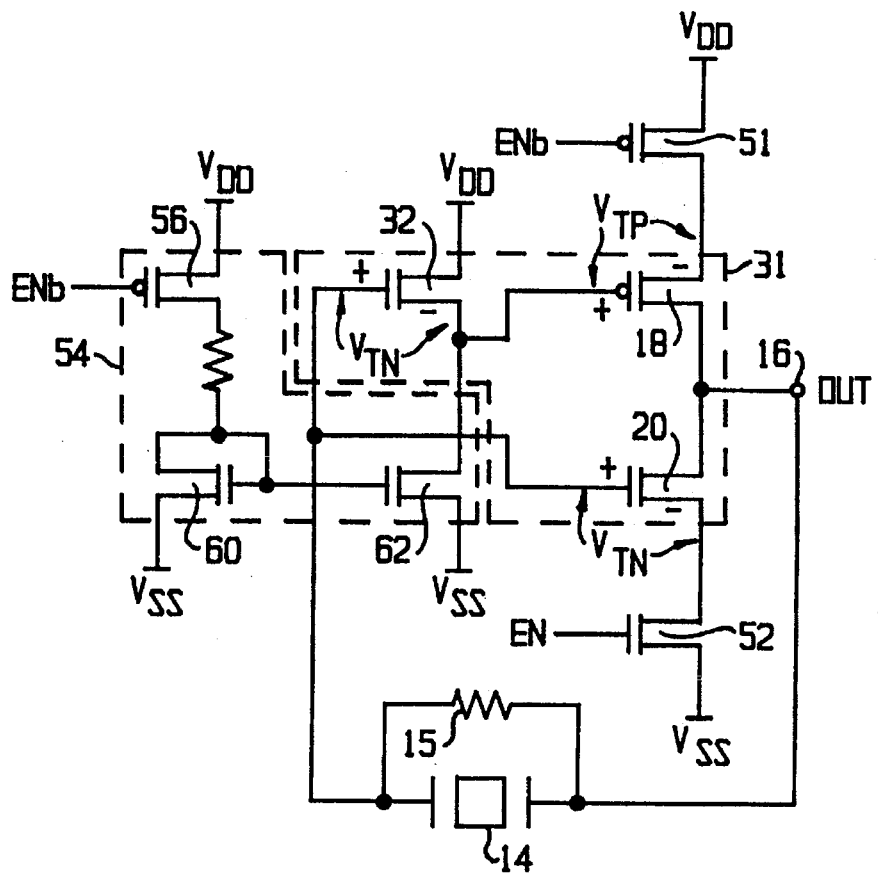

Referring now to FIG. 4, a detailed schematic diagram is shown including oscillator circuit 30 of FIG. 2 having circuitry for alternately operating in an on or off state. Components shown in FIG. 4 that are identical to components shown in FIGS. 1 and 2 are identified by the same reference numbers. The on/off oscillator circuit of FIG. 4 further includes P- and N-channel transistors 51 and 52. P-channel transistor 51 has a source electrode coupled to receive operating potential $V_{DD}$ and a drain electrode coupled to the source electrode of transistor 18. The gate electrode of transistor 51 is coupled to receive the complement (ENb) of an enable control signal (EN). N-channel transistor 52 has a source electrode coupled to receive operating potential $V_{SS}$ and a drain electrode coupled to the source electrode of transistor 20. The gate electrode of transistor 52 is coupled to receive the enable control signal (EN).

The circuit of FIG. 4 further includes switchable current source 54 for providing a bias current for transistor 32 when current source 54 is enabled. Current source 54 includes transistor 56 having a source electrode coupled to receive operating potential $V_{DD}$ and a drain electrode coupled through resistor 58 to the gate and drain electrodes of transistor 60. The gate electrode of transistor 56 is coupled to receive control signal ENb, and the source electrode of transistor 60 is coupled to receive voltage $V_{SS}$. Transistor 62 has a gate electrode coupled to the gate electrode of transistor 60. Further, the drain electrode of transistor 62 is coupled to the source electrode of transistor 32, and the source electrode of the former is coupled to receive voltage $V_{SS}$.

In operation, when control signal EN is a logic high and the complementary control signal ENb is a logic low, the oscillator circuit of FIG. 4 is placed in an "on" state wherein transistors 51, 52 and 56 are active, and the operation is as described above for the circuit of FIG. 2. However, when control signal EN is a logic low and the complementary control signal ENb is a logic high, the oscillator circuit of FIG. 4 is placed in an "off" state. Transistors 51 and 52 are disabled (i.e., turned off) thereby disabling transistors 18 and 20. Moreover, transistor 56 is disabled, which turns off switchable current source 54, and disables transistor 32.

By now it should be apparent that a novel oscillator circuit for starting-up and operating at low supply voltages has been provided. The oscillator circuit includes an inverter circuit coupled across first and second terminals of a resonant circuit. The inverter circuit includes a push-pull driver stage having complementary P-channel and N-channel transistors. The common drain electrodes of each are coupled to the second terminal of resonant circuit 14 and provide the oscillatory signal. The source electrodes of the P- and N-channel transistors are respectively coupled to first and second supply voltage terminals. The gate electrode of the first transistor is coupled to the first terminal of resonant circuit 14. The inverter circuit further includes a circuit for shifting the voltage level applied to the gate electrode of the second transistor, relative to the voltage applied to the gate electrode of the first transistor, by a predetermined voltage. This has the effect of overlapping the operating voltage ranges of the both transistors and reducing the required operating voltage range of the inverter circuit to maintain both transistors active.

Although certain preferred embodiments and methods have been disclosed herein, it will be apparent to those skilled in the art from consideration of the foregoing description that variations and modifications of the described embodiments and methods may be made without departing from the true spirit and scope of the invention. Accordingly, it is intended that the invention shall be limited only to the extent required by the appended claims and the rules and principles of applicable law.

What is claimed is:

1. An oscillator circuit for providing an output signal that oscillates at a predetermined frequency, the oscillator circuit including an inverter circuit that is coupled across first and second terminals of a resonant circuit, the inverter circuit including first and second transistors having common drain electrodes coupled to the output of the oscillator circuit and to the second terminal of the resonant circuit, the source electrodes of the first and second transistors respectively coupled to first and second supply voltage terminals, the gate electrode of one of the transistors coupled to the first terminal of the resonant circuit, the improvement comprising:

circuit means coupled between the first terminal of the resonant circuit and the gate electrode of the other transistor for level shifting the voltage applied to the gate electrode of the other transistor relative to the voltage applied to the gate electrode of the one transistor to maintain the first and second transistors active and thereby allow the oscillator circuit to start-up and operate at relatively low supply voltages.

2. The oscillator circuit according to claim 1 wherein the minimum difference between voltages applied to the first and second supply voltage terminals to maintain the first and second transistors active is the maximum of the threshold voltages of the first and second transistors, less a threshold voltage applicable to said circuit means.

3. The oscillator circuit according to claim 1 wherein said circuit means includes an N-channel transistor having drain, source and gate electrodes, said drain electrode and said source electrode of said N-channel transistor respectively coupled between said first and second supply voltage terminals, said source electrode of said N-channel transistor coupled to the gate electrode of the first transistor, said gate electrode of said N-channel transistor coupled to the first terminal of the resonant circuit.

4. The oscillator circuit according to claim 1 wherein said circuit means includes a P-channel transistor having drain, source and gate electrodes, said source and drain electrodes of said P-channel transistor respectively coupled between said first and second supply voltage terminals, said source electrode of said P-channel transistor coupled to the gate electrode of the second transistor, said gate electrode of said N-channel transistor coupled to the first terminal of the resonant circuit.

5. The oscillator circuit according to claim 1 further including means for alternatively operating the oscillator circuit in an on or off state.

6. An oscillator circuit including an inverter circuit and a resonant circuit for starting-up and operating at low voltages, the inverter circuit being coupled across first and second terminals of the resonant circuit, the inverter circuit comprising:

a push-pull output driver stage including first and second complementary transistors each having drain, source and gate electrodes, said source electrodes said first and second transistors respectively coupled to first and second supply voltage terminals, said drain electrodes of said first and second transistors coupled to the second terminal of the resonant circuit, said gate electrode of said second transistor coupled to the first terminal of the resonant circuit; and voltage level shifting means coupled between the first terminal of the resonant circuit and said gate electrode of said first transistor for shifting the voltage applied to said gate electrode of said first transistor relative to the voltage applied to said gate electrode of said second transistor.

7. The oscillator circuit according to claim 6 wherein the minimum difference between voltages applied to the first and second supply voltage terminals to maintain the first and second transistors active is the maximum of the threshold voltages of the first and second transistors, less a threshold level of said voltage level shifting means.

8. The oscillator circuit according to claim 6 wherein said voltage level shifting means includes a source follower N-channel transistor.

9. The oscillator circuit according to claim 6 wherein said voltage level shifting means includes a source follower P-channel transistor.

10. The oscillator circuit according to claim 6 further including means for alternately operating the oscillator circuit in an on or off state.

11. A push-pull inverter circuit having an input and an output for operating at low voltages, comprising:

first and second complementary transistors, said first transistor having current carrying electrodes coupled between the output of the inverter circuit and a first supply voltage terminal, said second transistor having current carrying electrodes coupled between the output of the inverter circuit and a second supply voltage terminal, a control electrode of the first transistor coupled to the input of the inverter circuit;

a resonant circuit coupled across the output of the inverter circuit and the control electrodes of the first and second transistors, and voltage level shifting circuit means coupled between the input of the inverter circuit and a control electrode of the second transistor for shifting the voltage applied to the control electrode of the second transistor relative to the voltage applied to the control electrode of the first transistor, thereby allowing both transistors to remain active at low supply voltages so as to initiate oscillation upon powering up the inverter circuit.

12. The inverter circuit according to claim 11 wherein the minimum difference between voltages applied to the first and second supply voltage terminals to maintain the first and second transistors active is the maximum of the threshold voltages of the first and second transistors, less a threshold voltage of the voltage level shifting circuit means.

13. The inverter circuit according to claim 11 wherein said voltage level shifting means includes a source follower N-channel transistor for shifting the voltage applied to the control electrode of the second transistor by the threshold voltage of said N-channel transistor.

14. The inverter circuit according to claim 11 wherein said voltage level shifting means includes a source follower P-channel transistor for shifting the voltage applied to the control electrode of the second transistor by the threshold voltage of said P-channel transistor.

* * * * *